(12) United States Patent
Hwang (10) Patent No.: US 8,178,912 B2
(45) Date of Patent: May 15, 2012

(54) IMAGE SENSOR FOR MINIMIZING A DARK CURRENT AND METHOD FOR MANUFACTURING THE SAME

(75) Inventor: Joon Hwang, Cheongju-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 640 days.

(21) Appl. No.: 12/244,898

(22) Filed: Oct. 3, 2008

(65) Prior Publication Data

US 2009/0166689 A1 Jul. 2, 2009

(30) Foreign Application Priority Data

Dec. 28, 2007 (KR) .................. 10-2007-0139746
Jun. 30, 2008 (KR) .................. 10-2008-0062707

(51) Int. Cl.
*H01L 31/062* (2012.01)
*H01L 31/113* (2006.01)

(52) U.S. Cl. ........ 257/291; 257/292; 257/461; 257/463; 257/E31.057

(58) Field of Classification Search .................. 257/290, 257/291, 292, 461, 463, E31.057
See application file for complete search history.

(56) References Cited

U.S. PATENT DOCUMENTS

| | | | |
|---|---|---|---|
| 2006/0214199 A1 | 9/2006 | Inoue et al. | |
| 2007/0018075 A1* | 1/2007 | Cazaux et al. | 250/208.1 |
| 2007/0285545 A1* | 12/2007 | Hsieh | 348/294 |
| 2009/0039397 A1* | 2/2009 | Chao | 257/233 |
| 2009/0065822 A1 | 3/2009 | Hwang | |
| 2009/0065823 A1 | 3/2009 | Hwang | |
| 2009/0065829 A1* | 3/2009 | Kim | 257/292 |
| 2009/0224351 A1* | 9/2009 | Hsieh | 257/444 |
| 2009/0242950 A1* | 10/2009 | McCarten et al. | 257/292 |
| 2010/0248412 A1* | 9/2010 | Guidash | 438/65 |

FOREIGN PATENT DOCUMENTS

| | | |
|---|---|---|
| DE | 102008046031 | 3/2009 |
| DE | 102008046037 | 4/2009 |
| JP | 59-178769 | 10/1984 |
| JP | 2006-120922 | 5/2006 |
| JP | 2006-25321 | 9/2006 |
| KR | 1020070019452 | 12/2005 |
| KR | 1020070000578 | 1/2007 |
| KR | 1020070019452 | 2/2007 |
| WO | WO-2007001146 | 1/2007 |

* cited by examiner

*Primary Examiner* — Ngan Ngo (74) *Attorney, Agent, or Firm* — Sherr & Vaughn, PLLC (57) ABSTRACT

An image sensor includes a first substrate, readout circuitry, an electrical junction region, a metal interconnection and an image sensing device. The readout circuitry is formed on and/or over the first substrate and the electrical junction region is formed in the first substrate and electrically connected to the readout circuitry. The metal interconnection is electrically connected to the electrical junction region. The image sensing device is formed on and/or over the metal interconnection.

7 Claims, 8 Drawing Sheets

IMAGE SENSOR FOR MINIMIZING A DARK CURRENT AND METHOD FOR MANUFACTURING THE SAME

The present application claims under 35 U.S.C. §119 to Korean Patent Application No. 10-2007-0139746 (filed Dec. 28, 2007) and Korean Patent Application No. 10-2008-0062707 (filed Jun. 30, 2008), which are hereby incorporated by reference in their entirety.

BACKGROUND

An image sensor is a semiconductor device for converting an optical image into an electrical signal. The image sensor may be roughly classified into a charge coupled device (CCD) and a complementary metal oxide semiconductor (CMOS) image sensor (CIS). During the fabrication of image sensors, a photodiode may be formed in a substrate using ion implantation. As the size of a photodiode is reduced for the purpose of increasing the number of pixels without increasing chip size, the area of a light receiving portion is also reduced, thereby resulting in a reduction in image quality. Also, since a stack height does not reduce as much as the reduction in the area of the light receiving portion, the number of photons incident to the light receiving portion is also reduced due to diffraction of light called airy disk.

As an alternative to overcome this limitation, an attempt of forming a photodiode using amorphous silicon (Si), or forming a readout circuitry in a silicon (Si) substrate using a method such as wafer-to-wafer bonding, and forming a photodiode on and/or over the readout circuitry has been made (referred to as a "three-dimensional (3D) image sensor). The photodiode is connected with the readout circuitry through a metal interconnection.

Since both the source and the drain in both sides of the transfer transistor are heavily doped with N-type impurities, a charge sharing phenomenon occurs. When the charge sharing phenomenon occurs, the sensitivity of an output image is reduced and an image error may be generated. Also, because a photo charge does not readily move between the photodiode and the readout circuitry, a dark current is generated and/or saturation and sensitivity is reduced.

SUMMARY

Embodiments relate to an image sensor and a manufacturing method thereof that prevents occurrence of charge sharing while increasing a fill factor.

Embodiments relates to an image sensor and a manufacturing method thereof that minimizes a dark current source and prevents reduction in saturation and sensitivity by providing a swift movement path for a photo charge between a photodiode and a readout circuitry.

Embodiments relate to an image sensor that may include at least one of the following: a readout circuitry on and/or over a first substrate; an electrical junction region in the first substrate, the electrical junction region being electrically connected to the readout circuitry; a metal interconnection electrically connected to the electrical junction region; and an image sensing device on and/or over the metal interconnection.

Embodiments relate to an image sensor that may include at least one of the following: a second conduction type substrate; readout circuitry formed over the second conduction type substrate; an electrical junction region formed in the second conduction type substrate and electrically connected to the readout circuitry, the electric junction region including a second conduction type well formed in the second conduction type substrate, a first conduction type ion implantation layer formed in the second conduction type well and a second conduction type ion implantation layer formed over the first conduction type ion implantation layer; a first conduction type connection region formed extending through the second conduction type ion implantation layer; a metal interconnection formed over the second conduction type substrate and electrically connected to the electrical junction region through the first conduction type connection region; and an image sensing device formed over the metal interconnection, the image sensing device including a high concentration first conduction type conduction layer formed over and contacting the metal interconnection, a first conduction type conduction layer formed over the high concentration first conduction type conduction layer, and a second conduction type conduction layer formed over the first conduction type conduction layer.

Embodiments relate to a method for manufacturing an image sensor that may include at least one of the following steps: forming a readout circuitry on and/or over a first substrate; and then forming an electrical junction region in the first substrate which is electrically connected to the readout circuitry; and then forming a metal interconnection on and/or over the first substrate which is electrically connected to the electrical junction region; and then forming an image sensing device on and/or over the metal interconnection.

Embodiments relate to a method for manufacturing an image sensor that may include at least one of the following steps: forming readout circuitry over a first substrate; and then forming an electrical junction region in the first substrate and electrically connected to the readout circuitry; and then forming a metal interconnection over the first substrate and electrically connected to the electrical junction region; and then forming an image sensing device over and contacting the metal interconnection.

DRAWINGS

Example

DESCRIPTION

Figure 1:
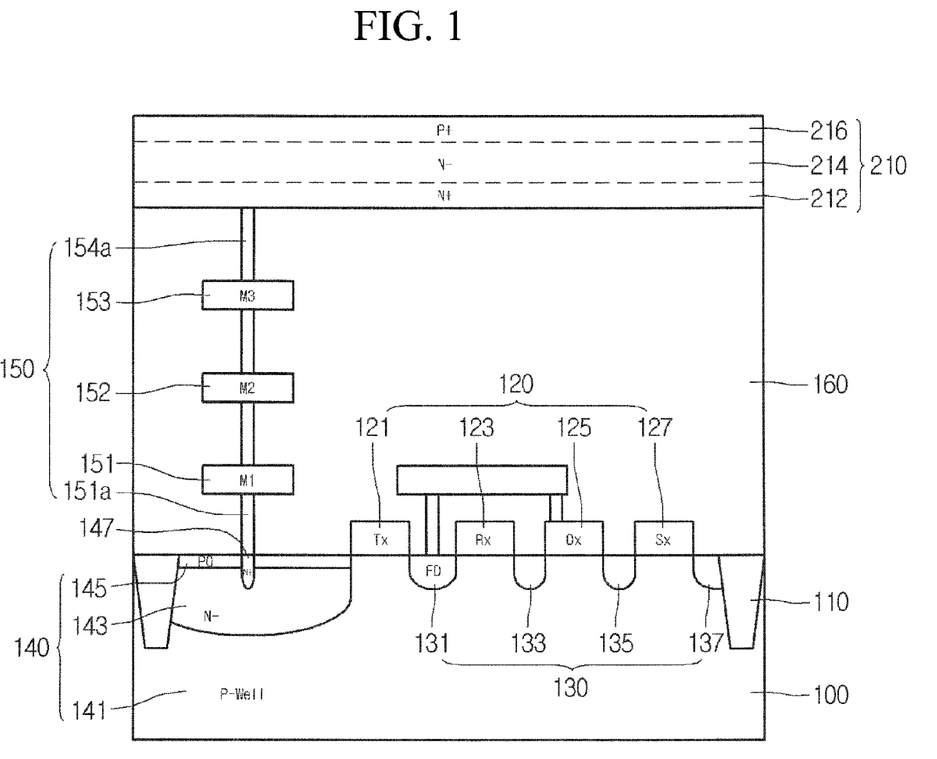
FIGS. 1 through 9 illustrate an image sensor and a method for manufacturing an image sensor in accordance with embodiments.

As illustrated in example FIG. 1, an image sensor in accordance with embodiments can include readout circuitry 120 formed on and/or over a first substrate 100, electrical junction region 140 formed in first substrate 100 and electrically connected to readout circuitry 120, metal interconnection 150 electrically connected to electrical junction region 140, and image sensing device 210 formed on and/or over metal interconnection 150. First substrate 100 can be but is not limited to a second conduction type substrate. Image sensing device 210 can be but is not limited to a photodiode. Image sensing device 210 can be a photodiode, a photogate or any combination thereof. Although embodiments describe a photodiode as being formed in a crystalline semiconductor layer, the photodiode is not limited thereto but can be formed in an amorphous semiconductor layer.

As illustrated in example FIGS. 2 to 7, a method for manufacturing such an image sensor in accordance with embodiments may include providing first substrate 100 in which metal interconnection 150 and readout circuitry 120 are formed. First substrate 100 can be but is not limited to a second conduction type substrate. For example, device isolation layer 110 is formed in second conduction type first substrate 100 to thereby define an active region. Readout circuitry 120 including at least one transistor is formed in the active region. For example, readout circuitry 120 can include transfer transistor (Tx) 121, reset transistor (Rx) 123, drive transistor (Dx) 125 and select transistor (Sx) 127. Floating diffusion region (FD) 131 of ion implantation regions 130 including source/drain regions 133, 135, and 137 of respective transistors can then be formed. In accordance with embodiments, a noise removal circuit can be formed in order to maximize sensitivity.

The forming of readout circuitry 120 on and/or over first substrate 100 can include forming electrical junction region 140 in first substrate 100 and forming first conduction type connection region 147 interposed between and electrically connected to metal interconnection 150 and electrical junction region 140. Electrical junction region 140 can be but is not limited to a PN junction. For example, electrical junction region 140 can include first conduction type ion implantation layer 143 formed on and/or over second conduction type well 141 or a second conduction type epitaxial layer, and second conduction type ion implantation layer 145 formed on and/or over first conduction type ion implantation layer 143. As illustrated in example FIG. 2, PN junction 140 can be but is not limited to a P0 (145)/N− (143)/P− (141) junction.

Figure 2:
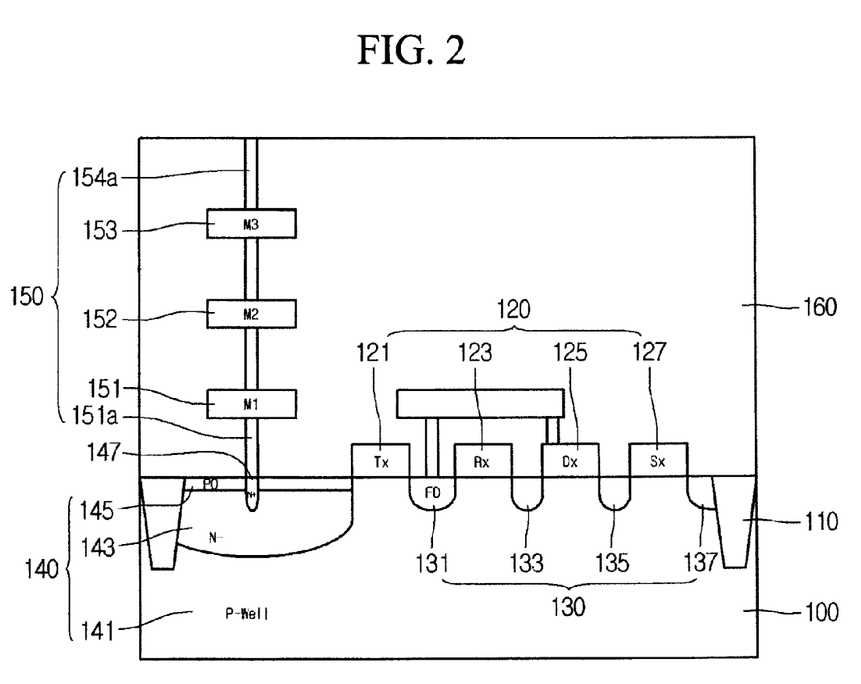

In accordance with embodiments, a device is designed such that there is a potential difference between the source and drain on both sides of transfer transistor (Tx) 121 so that a photo charge can be fully dumped. Accordingly, a photo charge generated from the photodiode is fully dumped to the floating diffusion region so that the sensitivity of an output image can be maximized. Meaning, electrical junction region 140 is formed in first substrate 100 where readout circuitry 120 to permit generation of a potential difference between the source and the drain on both sides of transfer transistor (Tx) 121 so that a photo charge can be fully dumped.

Hereinafter, a dumping structure of a photo charge in accordance with embodiments is described in detail. Unlike a node of floating diffusion (FD) 131, which is an N+ junction, P/N/P junction 140, which is electrical junction region 140 and to which an applied voltage is not fully transferred, is pinched-off at a predetermined voltage. This voltage is called a pinning voltage, which depends on the doping concentrations of P0 region 145 and N− region 143. Specifically, an electron generated from the photodiode 210 moves to the PNP junction 140, and is transferred to the node of floating diffusion (FD) 131 and converted into a voltage when the transfer transistor Tx 121 is turned on. Since a maximum voltage value of P0/N−/P− junction 140 becomes a pinning voltage, and a maximum voltage value of the node of floating diffusion (FD) 131 becomes a threshold voltage $V_{th}$ of $V_{dd-Rx}$ 123, an electron generated from photodiode 210 in the upper portion of a chip can be fully dumped to the node of floating diffusion (FD) 131 without charge sharing by a potential difference between both sides of transfer transistor (Tx) 131. Meaning, in accordance with embodiments, the P0/N−/P-well junction, not an N+/P-well junction, is formed in a silicon substrate such as first substrate 100 to allow a + voltage to be applied to N− 143 of the P0/N−/P-well junction and a ground voltage to be applied to P0 145 and P-well 141 during a 4-Tr active pixel sensor (APS) reset operation, so that a pinch-off is generated to the P0/N−/P-well double junction at a predetermined voltage or more as in a bipolar junction transistor (BJT) structure. This is called a pinning voltage. Therefore, a potential difference is generated between the source and the drain at both sides of transfer transistor (Tx) 121 to prevent a charge sharing phenomenon during the on/off operations of transfer transistor (Tx) 121. Therefore, unlike a case where a photodiode is simply connected to an N+ junction, limitations such as saturation reduction and sensitivity reduction can be avoided in accordance with embodiments.

Next, first conduction type connection region 147 is formed between the photodiode and the readout circuitry to provide a swift movement path of a photo charge, so that a dark current source is minimized, and saturation reduction and sensitivity reduction can be prevented. For this purpose, first conduction type connection region 147 for ohmic contact can be formed on and/or over the surface of P0/N−/P− junction 140 in accordance with embodiments. N+ region 147 can be formed to extend through P0 region 145 and contact N− region 143. In order to prevent first conduction type connection region 147 from becoming a leakage source, the width of first conduction type connection region 147 can be minimized. Therefore, in accordance with embodiments, a plug implant can be performed after first metal contact 151a is etched, but a process is not limited thereto. For example, an ion implantation pattern may be formed and first conduction type connection region 147 is then formed using the ion implantation pattern as an ion implantation mask. Meaning, the reason of locally and heavily doping only a contact forming portion with N-type impurities in accordance with embodiments is to facilitate ohmic contact formation while minimizing a dark signal. In case of heavily doping the entire transfer transistor source, a dark signal may be increased by a Si surface dangling bond.

Next, interlayer dielectric 160 can be formed on and/or over first substrate 100. Metal interconnection 150 can then be formed extending through interlayer dielectric 160 and electrically connected to first conduction type connection region 147. Metal interconnection 150 can include but is not limited to first metal contact 151a, first metal 151, second metal 152, third metal 153 and fourth metal contact 154a.

Figure 3:
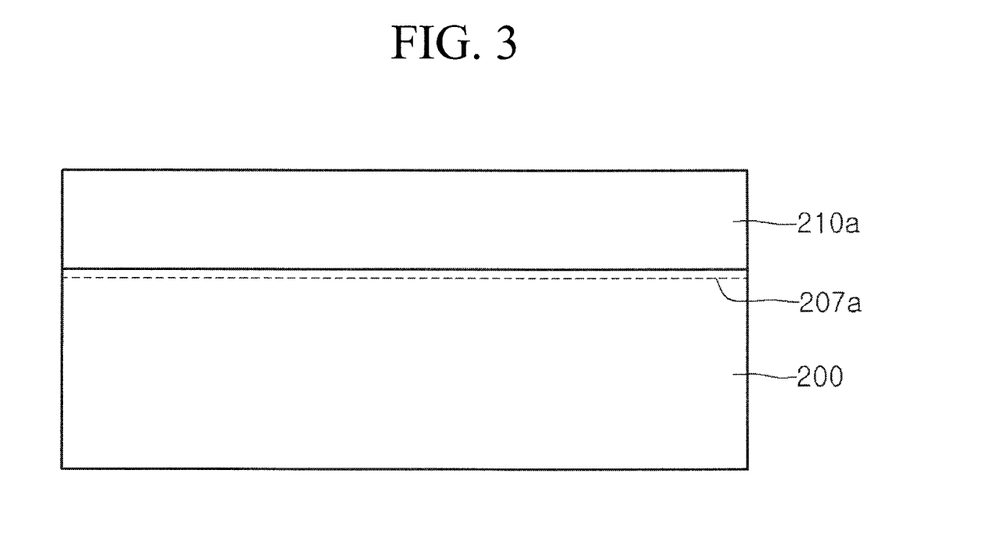

As illustrated in example FIG. 3, next, crystalline semiconductor layer 210a is formed on and/or over second substrate 200. In accordance with embodiments, photodiode 210 is formed in crystalline semiconductor layer 210a. Accordingly, the image sensing device adopts a 3-dimentional (3D) image sensor located on and/or over the readout circuitry to raise a fill factor, and is formed inside the crystalline semiconductor layer so that a defect inside the image sensing device can be prevented. For example, crystalline semiconductor layer 210a is formed on and/or over second substrate 200 using epitaxial growth. After that, hydrogen ions are implanted between second substrate 200 and crystalline semiconductor layer 210a to form hydrogen ion implantation layer 207a interposed between second substrate 200 and crystalline semiconductor layer 210a. The implantation of the hydrogen ions can be performed after the ion implantation for forming photodiode 210.

Figure 4:
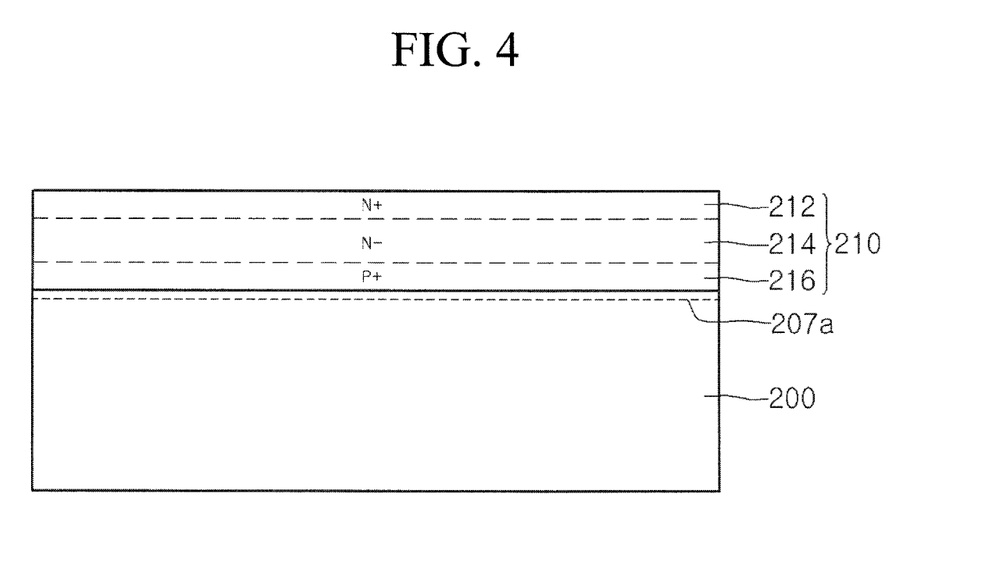

As illustrated in example FIG. 4, next, photodiode 210 is formed in crystalline semiconductor layer 210a using ion implantation. For example, second conduction type conduction layer 216 is formed in the lower portion of crystalline semiconductor layer 210a and on and/or over and contacting hydrogen ion implantation layer 207a. High concentration P-type conduction layer 216 can be formed in the lower portion of crystalline semiconductor layer 210a by performing a first blanket-ion implantation on the entire surface of second substrate 200 without a mask. After that, first conduction type conduction layer 214 is formed on and/or over second conduction type conduction layer 216 by performing a second blanket-ion implantation on the entire surface of second substrate 200 without a mask. After that, high concentration first conduction type conduction layer 212 is formed on and/or over first conduction type conduction layer 214 by performing a third blanket-ion implantation on the entire surface of second substrate 200 without a mask so that first conduction type conduction layer 214 can contribute to ohmic contact.

Figure 5:
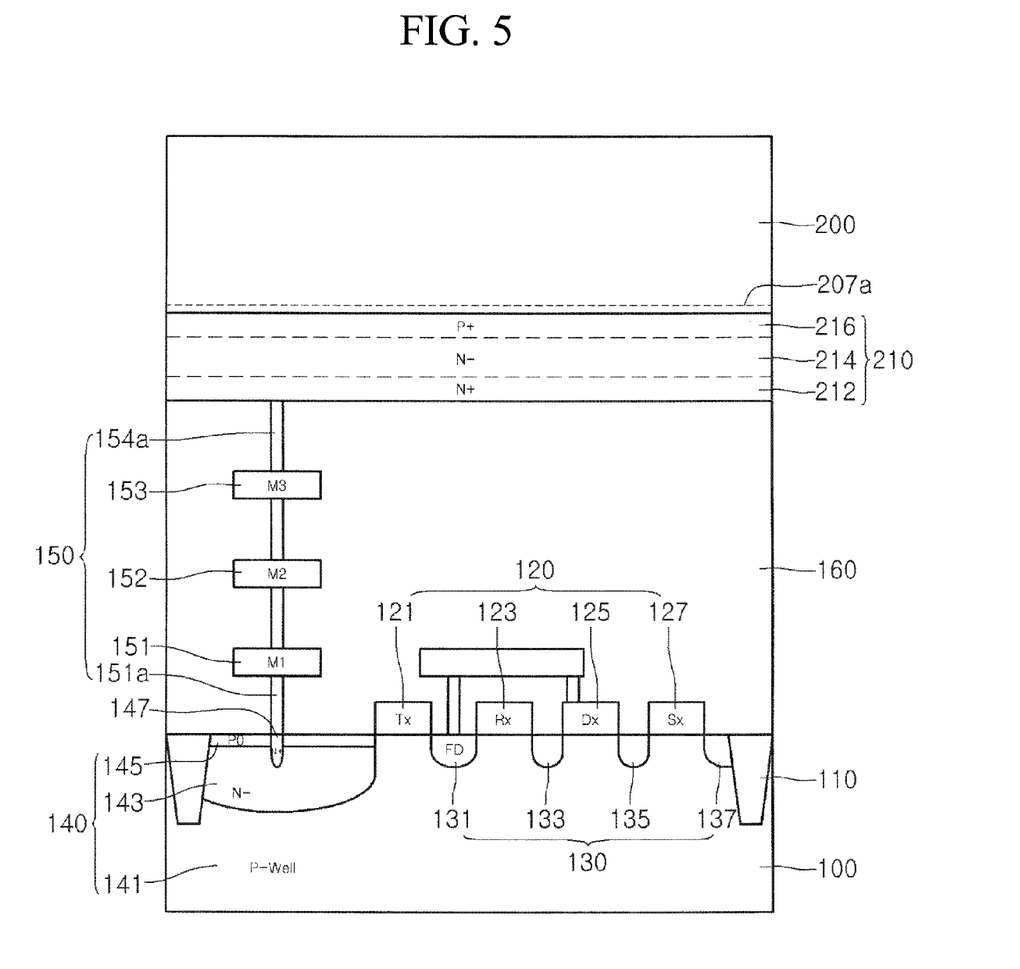

As illustrated in example FIG. 5, next, first substrate 100 and second substrate 200 are bonded such that photodiode 210 contacts metal interconnection 150. Before first substrate 100 and second substrate 200 are bonded to each other, the bonding can be performed by increasing the surface energy of a surface to be bonded through activation by plasma. The bonding can be performed with a dielectric or a metal layer disposed on and/or over a bonding interface in order to maximize the bonding force.

Figure 6:
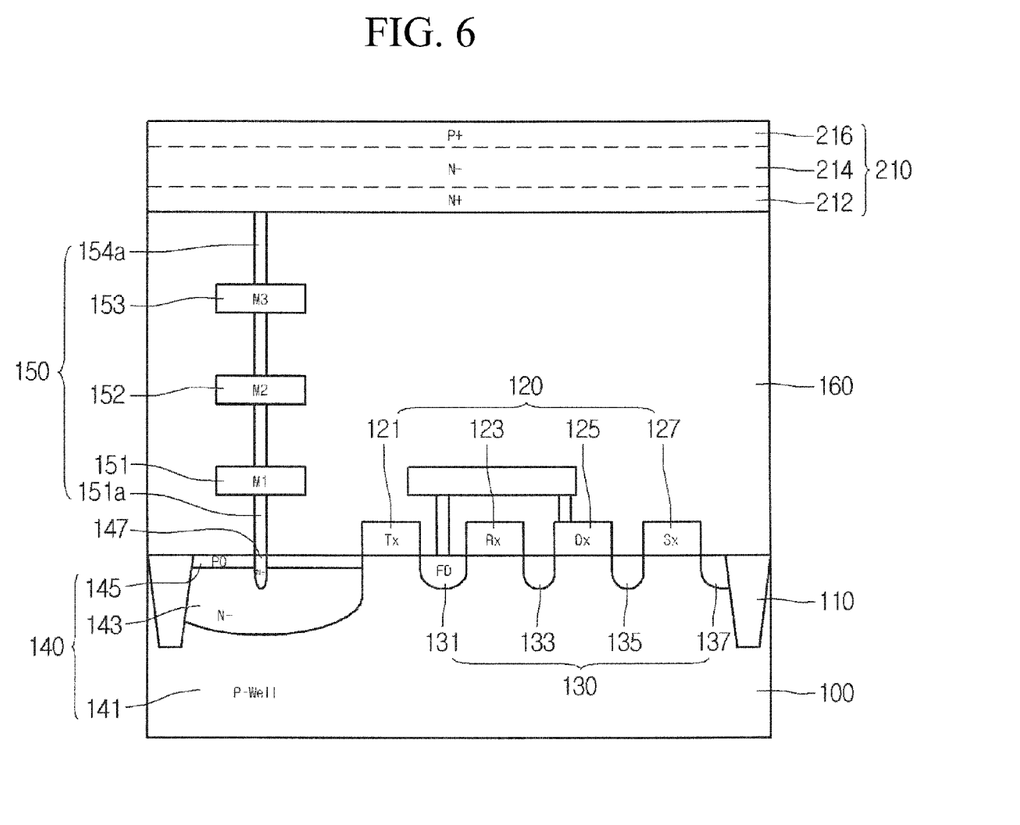

As illustrated in example FIG. 6, after that, hydrogen ion implantation layer 207a can be changed into a hydrogen gas layer by performing heat treatment on second substrate 200. A portion of second substrate 200 can then be removed with photodiode 210 left under the hydrogen gas layer so that photodiode 210 can be exposed. The removal of second substrate 200 can be performed using a cutting apparatus such as a blade. An etching process separating the photodiode for each unit pixel can then be performed. The etched portion can then be filled with an interpixel dielectric.

Figure 7:
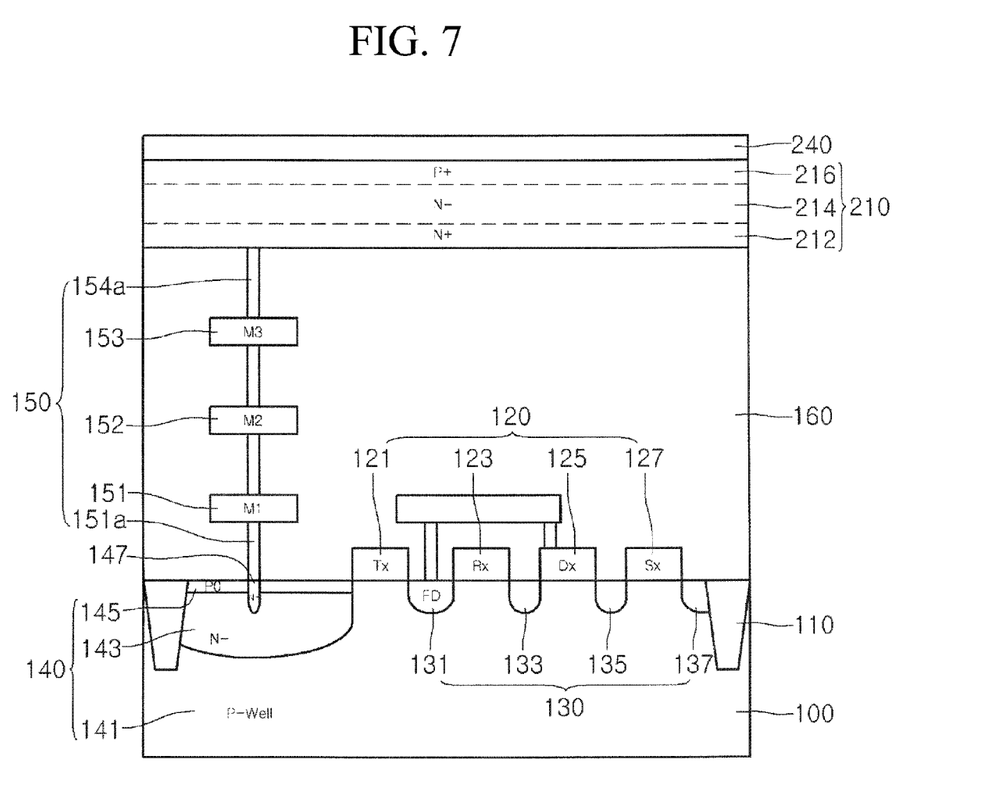

As illustrated in example FIG. 7, processes for forming upper electrode 240 and a color filter can then be performed.

In the image sensor and the manufacturing method thereof in accordance with embodiments, a device is designed such that there is a potential difference between the source and drain in both sides of the transfer transistor Tx, so that a photo charge can be fully dumped. Also, the charge connection region is formed between the photodiode and the readout circuitry to provide a swift movement path of a photo charge, so that a dark current source is minimized, and saturation reduction and sensitivity reduction can be prevented. Moreover, a noise removal circuit can also be added so that sensitivity can be maximized.

Figure 8:
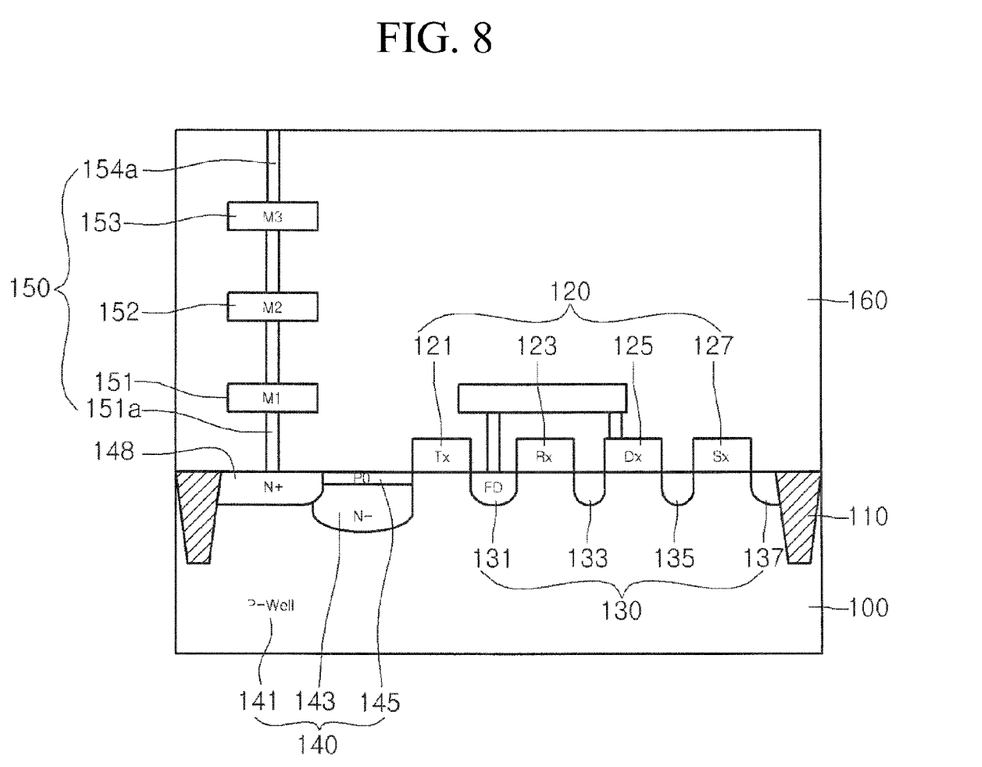

As illustrated in example FIG. 8, an image sensor in accordance with embodiments can include readout circuitry 120 formed on and/or over first substrate 100 and electrical junction region 140 formed in first substrate and electrically connected to readout circuitry 120. Metal interconnection 150 can be formed electrically connected to electrical junction region 140 and image sensing device 210 can be formed on and/or over metal interconnection 150. Embodiments illustrated in example FIG. 8 can adopt the technical characteristics of embodiments illustrated in example FIGS. 2 to 7. For example, a device is designed such that there is a potential difference between the source and drain in both sides of transfer transistor (Tx), so that a photo charge can be fully dumped. Also, a charge connection region is formed between a photodiode and the readout circuitry to provide a swift movement path of a photo charge, so that a dark current source is minimized, and saturation reduction and sensitivity reduction can be prevented. Unlike embodiments illustrated in example FIGS. 2 to 7, first conduction type connection region 148 is formed spaced laterally on and/or over one side of electrical junction region 140. Alternatively, N+ connection region 148 for ohmic contact can be formed on and/or over P0/N−/P− junction 140.

A process of forming N+ connection region 148 and M1C contact 151a may provide a leakage source because the device operates with a reverse bias applied to P0/N−/P− junction 140 and so an electric field (EF) can be generated on and/or over the Si surface. A crystal defect generated during the contact forming process inside the electric field serves as a leakage source. Also, in a case where N+ connection region 148 is formed on and/or over the surface of P0/N−/P− junction 140, an electric field can be generated due to N+/P0 junction 148/145. This electric field also serves as a leakage source. Therefore, embodiments proposes a layout in which first contact plug 151a is formed in an active region not doped with a P0 layer but including N+ connection region 148 and is connected to N− junction 143. In accordance with embodiments, the electric field is not generated on and/or over the Si surface, which can contribute to reduction in a dark current of a 3D integrated CIS.

Figure 9:
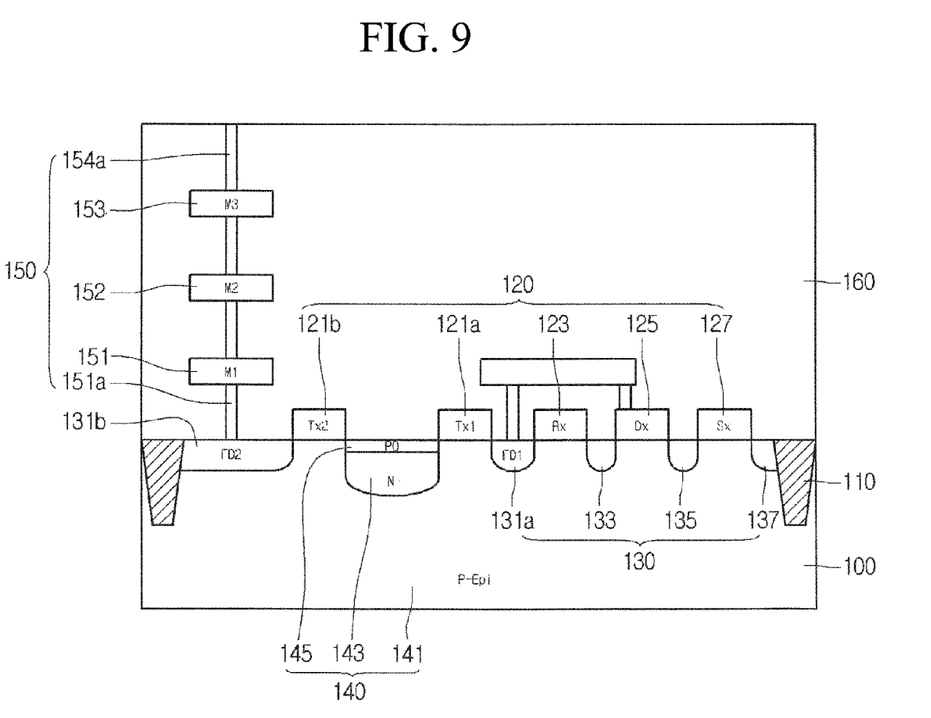

As illustrated in example FIG. 9, an image sensor in accordance with embodiments can include readout circuitry 120 formed on and/or over first substrate 100 and electrical junction region 140 formed in first substrate 100 and electrically connected to readout circuitry 120. Metal interconnection 150 is formed electrically connected to electrical junction region 140 and image sensing device 210 is formed on and/or over metal interconnection 150. Embodiments illustrated in example FIG. 9 can adopt the technical characteristics of embodiments illustrated in example FIGS. 2 to 8. For example, a device is designed such that there is a potential difference between the source and drain in both sides of transfer transistor (Tx), so that a photo charge can be fully dumped. Also, a charge connection region is formed between a photodiode and the readout circuitry to provide a swift movement path of a photo charge, so that a dark current source is minimized, and saturation reduction and sensitivity reduction can be prevented.

In accordance with embodiments, forming readout circuitry 120 on and/or over first substrate 100 is described in more detail as follows. Transfer transistor Tx which can include first transistor 121a and second transistor 121b are formed spaced apart on and/or over first substrate 100. First transistor 121a and second transistor 121b can be but are not limited to transfer transistors Tx. First transistor 121a and second transistor 121b can be formed simultaneously or sequentially. After that, electrical junction region 140 is formed in first substrate 100 in the space between first transistor 121a and second transistor 121b. For example, electrical junction region 140 can be but is not limited to PN junction 140. PN junction 140 can include first conduction type ion implantation layer 143 formed in second conduction type epitaxial layer (or well) 141, and second conduction type ion implantation layer 145 formed on and/or over first conduction type ion implantation layer 143. PN junction 140 can be but is not limited to P0/N− (143)/P− (141) junction illustrated in example FIG. 2.

After that, high concentration first conduction type connection region 131b connected to metal interconnection 150 is formed in substrate 100 on one side of second transistor 121b. High concentration first conduction type connection region 131b is a high concentration N+ ion implantation region (N+ junction) and can serve as but is not limited to a second floating diffusion region (FD 2) 131b. In accordance with embodiments, the readout circuitry includes a portion for moving an electron generated from the photodiode in the upper portion of a chip to N+ junction 131b of first substrate 100 in which the readout circuitry is formed, and a portion for moving an electron of N+ junction 131b to N− junction 143 in this time, so that a 4Tr operation can be realized.

The reason for forming P0/N−/P− junction 140 and N+ junction 131b separately is as follows. When N+ doping and a contact are formed in P/N/P junction 140 of P0/N−/P− epitaxial layer 140, a dark current is generated by N+ layer 131b and a contact etch damage. To prevent this dark current, N+ junction 131b, which is a contact formation portion, has been separated from P/N/P junction 140. Meaning, when the N+ doping and contact etch are performed on the surface of P/N/P junction 140, leakage sources are formed. To prevent these leakage sources, a contact has been formed in N+/P– epitaxial junction 131b. Since a gate of second transistor (Tx2) 121b is turned on during a signal readout operation, an electron generated from photodiode 210 in the upper portion of the chip passes through P0/N–/P– epitaxial junction 140 and moves to first floating diffusion region (FD 1) 131a, so that correlated double sampling can be realized.

Although embodiments relate generally to a complementary metal oxide semiconductor (CMOS) image sensor, such embodiments are not limited to the same and may be readily applied to any image sensor requiring a photodiode.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
   readout circuitry over a first substrate;
   an electrical junction region comprising a first conduction type ion implantation region in the first substrate and a second conduction type ion implantation region over the first conduction type ion implantation region in the first substrate, the electrical junction region being electrically connected to the readout circuitry;
   a first conduction type connection region formed extending through the second conduction type ion implantation layer;
   a metal interconnection formed over a second conduction type substrate and electrically connected to the electrical junction region through the first conduction type connection region; and
   an image sensing device over and contacting the metal interconnection.

2. The image sensor of claim 1, wherein the readout circuitry comprises a transistor such that a potential difference exists between a source and a drain in both sides of the transistor.

3. The image sensor of claim 2, further comprising ion implantation regions including a floating diffusion region in the first substrate, wherein the transistor comprises a transfer transistor and an ion implantation concentration of the source of the transfer transistor is lower than an ion implantation concentration of the floating diffusion region.

4. An image sensor comprising:
   readout circuitry over a first substrate;
   an electrical junction region comprising a first conduction type ion implantation region in the first substrate and a second conduction type ion implantation region over the first conduction type ion implantation region in the first substrate, the electrical junction region being electrically connected to the readout circuitry;
   a first conduction type connection region formed at a side of the electrical junction region and electrically connected to the electrical junction region;
   a metal interconnection formed over the first conduction type connection region and contacting the first conduction type connection region; and
   an image sensing device over and contacting the metal interconnection.

5. The image sensor of claim 4, wherein the readout circuitry comprises a first transistor and a second transistor over the first substrate, and the second transistor is disposed between the first conductive type connection region and the electrical junction region.

6. The image sensor of claim 1, wherein the electrical junction region comprises a PN junction.

7. An image sensor comprising:
   a second conduction type substrate;
   readout circuitry formed over the second conduction type substrate;
   an electrical junction region formed in the second conduction type substrate and electrically connected to the readout circuitry, the electric junction region including a second conduction type well formed in the second conduction type substrate, a first conduction type ion implantation layer formed in the second conduction type well and a second conduction type ion implantation layer formed over the first conduction type ion implantation layer;
   a first conduction type connection region formed extending through the second conduction type ion implantation layer;
   a metal interconnection formed over the second conduction type substrate and electrically connected to the electrical junction region through the first conduction type connection region; and
   an image sensing device formed over the metal interconnection, the image sensing device including a high concentration first conduction type conduction layer formed over and contacting the metal interconnection, a first conduction type conduction layer formed over the high concentration first conduction type conduction layer, and a second conduction type conduction layer formed over the first conduction type conduction layer.

* * * * *